(12) United States Patent
Gong et al.

(10) Patent No.: US 10,516,338 B2
(45) Date of Patent: Dec. 24, 2019

(54) VOLTAGE CONVERTER CONTROLLER, VOLTAGE CONVERTER AND METHOD FOR OPERATING A VOLTAGE CONVERTER

(71) Applicant: Infineon Technologies Austria AG, Villach (AT)

(72) Inventors: Xiaowu Gong, Singapore (SG); Gerald Deboy, Klagenfurt (AT); Yong Siang Teo, Singapore (SG); Zan Wang, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/189,800

(22) Filed: Nov. 13, 2018

(65) Prior Publication Data
US 2019/0149052 A1  May 16, 2019

(30) Foreign Application Priority Data
Nov. 14, 2017 (DE) .......... 10 2017 126 696

(51) Int. Cl.
*H02M 3/335* (2006.01)
*G01R 19/165* (2006.01)
*H02M 1/00* (2006.01)
*H02M 1/34* (2007.01)

(52) U.S. Cl.
CPC .. *H02M 3/33553* (2013.01); *G01R 19/16547* (2013.01); *H02M 3/33523* (2013.01); *H02M 3/33592* (2013.01); *H02M 2001/0048* (2013.01); *H02M 2001/0058* (2013.01); *H02M 2001/342* (2013.01)

(58) Field of Classification Search
CPC ......... H02M 3/33553; H02M 3/33592; H02M 2001/0048; H02M 3/33576; H02M 3/156; H02M 3/157; H02M 3/158; H02M 7/42; H02M 7/44; H02M 27/48; H02M 2007/4811
See application file for complete search history.

(56) References Cited

U.S. PATENT DOCUMENTS 5,377,091 A * 12/1994 Faulk ................ H02M 3/33569
363/21.16
5,430,633 A * 7/1995 Smith ............... H02M 3/33569
363/131

(Continued)

FOREIGN PATENT DOCUMENTS

DE      102015114036 A1    2/2016

OTHER PUBLICATIONS

"UCC 28780 Adaptive ZVS Active-Clamp Flyback Controller," Texas Instruments Data Sheet, Oct. 2017, 50 pp.

(Continued)

*Primary Examiner* — Adolf D Berhane
(74) *Attorney, Agent, or Firm* — Shumaker & Sieffert, P.A.

(57) ABSTRACT

Voltage converter controllers, voltage converters and methods are discussed regarding the adjustment of an on-time of an auxiliary switch of a voltage converter. First and second voltages are measured before a primary switch of the voltage converter is turned on and while the primary switch is turned on, and the on-time is adjusted based on the voltages.

26 Claims, 12 Drawing Sheets

(56) References Cited

U.S. PATENT DOCUMENTS

| | | | |
|---|---|---|---|
| 6,917,527 B2* | 7/2005 | Takada | H02M 3/158 |
| | | | 363/16 |
| 9,252,676 B2* | 2/2016 | Yang | H02M 3/33576 |
| 2006/0056205 A1* | 3/2006 | Kyono | H02M 1/32 |
| | | | 363/15 |
| 2006/0146584 A1* | 7/2006 | Aso | H02M 3/33507 |
| | | | 363/95 |
| 2006/0215424 A1* | 9/2006 | Aso | H02M 3/335 |
| | | | 363/21.01 |
| 2011/0305043 A1* | 12/2011 | Matsumoto | H02M 3/33592 |
| | | | 363/21.01 |
| 2013/0329463 A1* | 12/2013 | Chen | H02M 1/4258 |
| | | | 363/17 |
| 2015/0016153 A1 | 1/2015 | Orr et al. | |
| 2015/0280576 A1* | 10/2015 | Hinz | H02M 3/33507 |
| | | | 363/21.15 |
| 2018/0062529 A1* | 3/2018 | Song | H02M 3/33507 |
| 2018/0294734 A1* | 10/2018 | Song | H02M 3/33592 |
| 2018/0351462 A1* | 12/2018 | Li | H02M 3/33546 |

OTHER PUBLICATIONS

Adib et al., "New zero voltage switching PWM flyback converter," 1st Power Electronic & Drive Systems & Technologies Conference, Feb. 17-18, 2010, pp. 196-200.
Office Action, in the German language, from counterpart German Application No. 102017126696.8, dated Jul. 13, 2018, 6 pp.

* cited by examiner

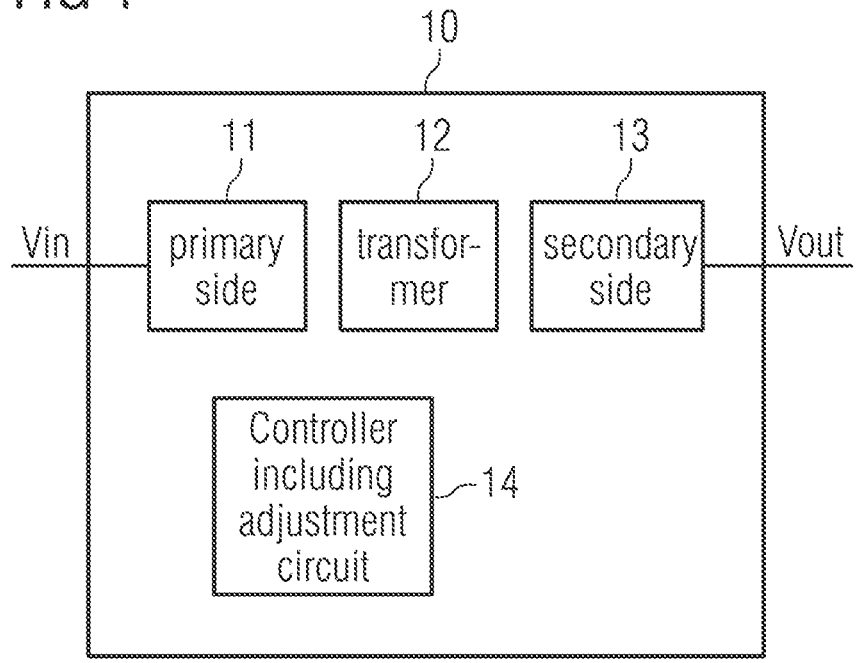
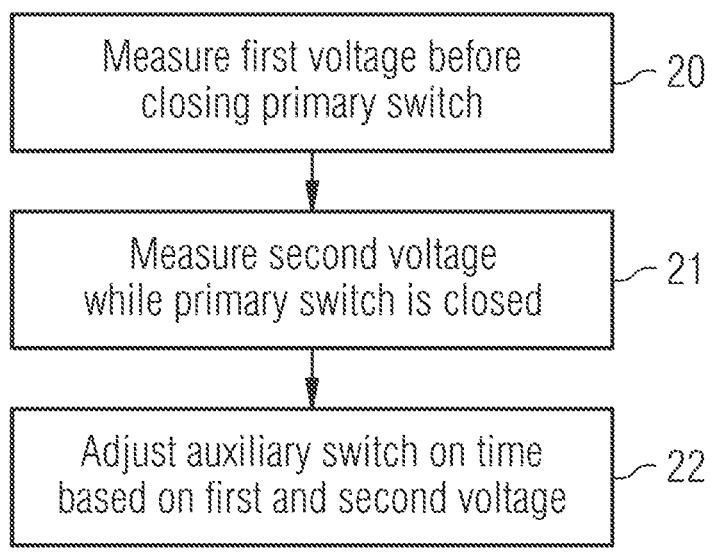

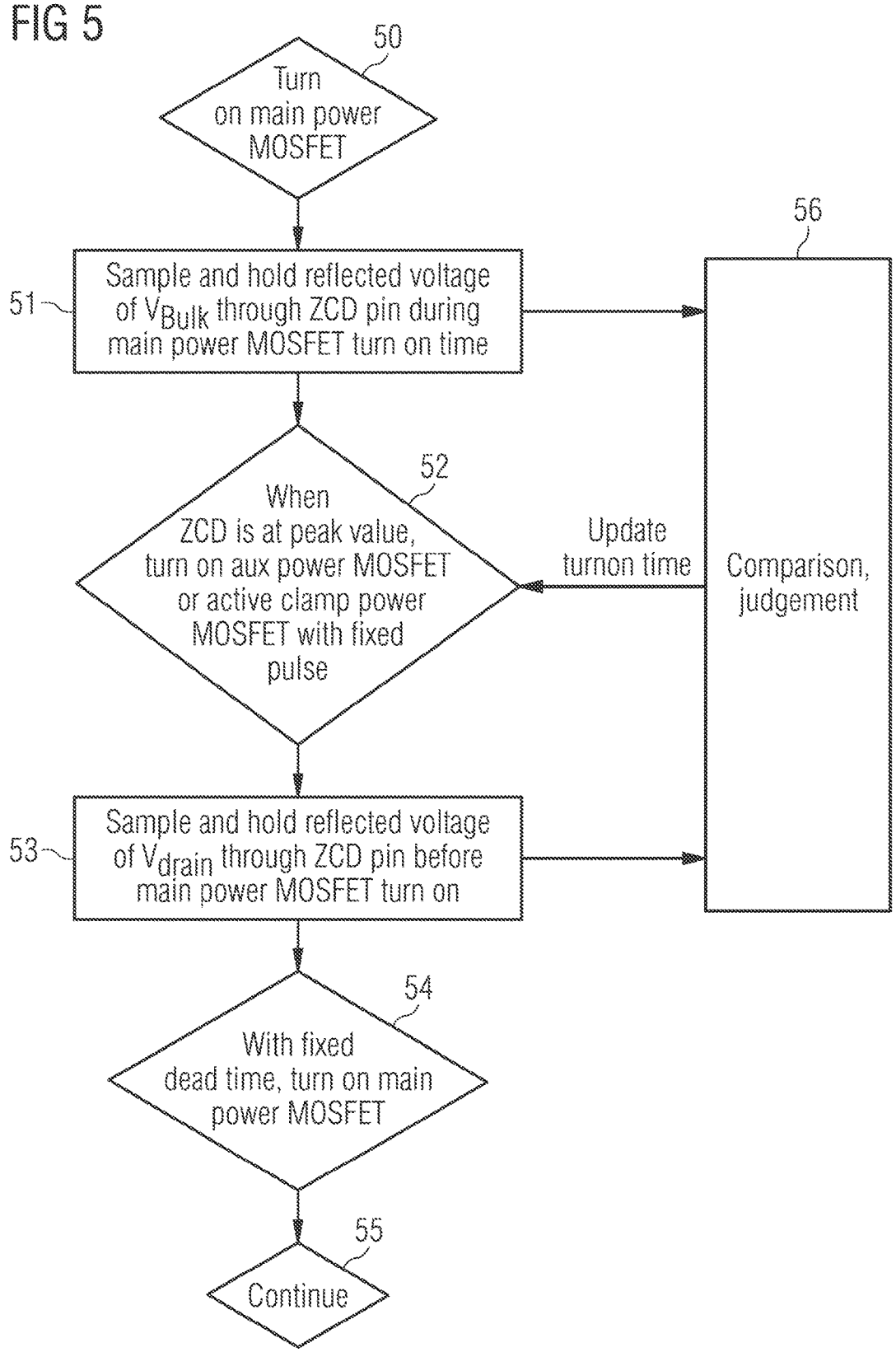

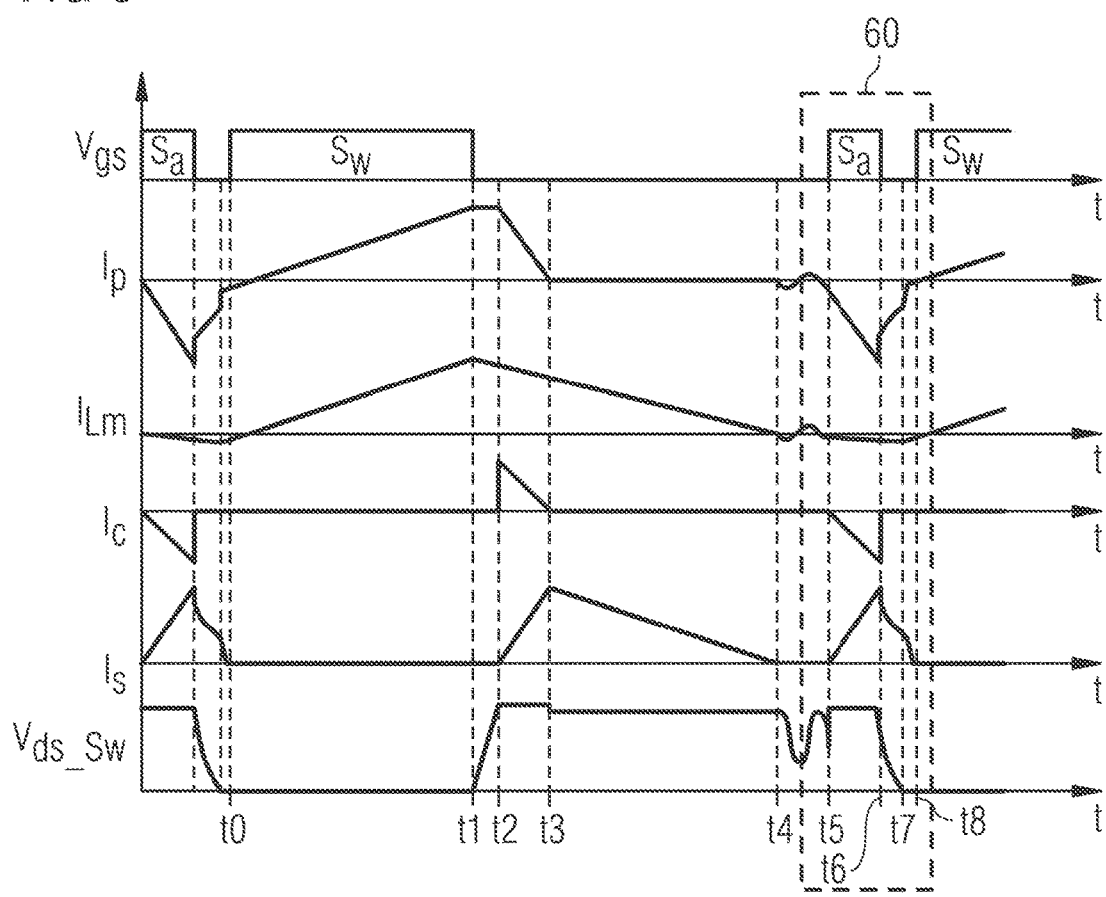

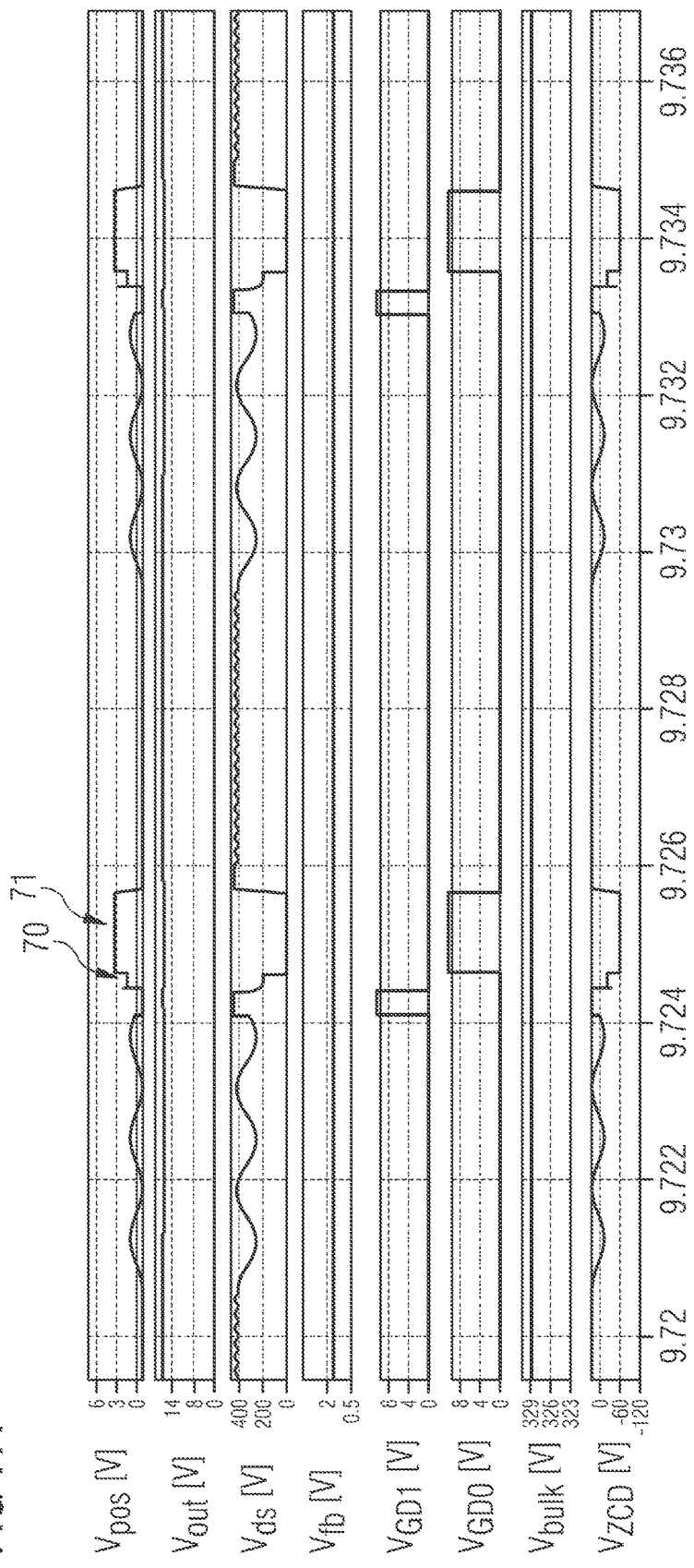

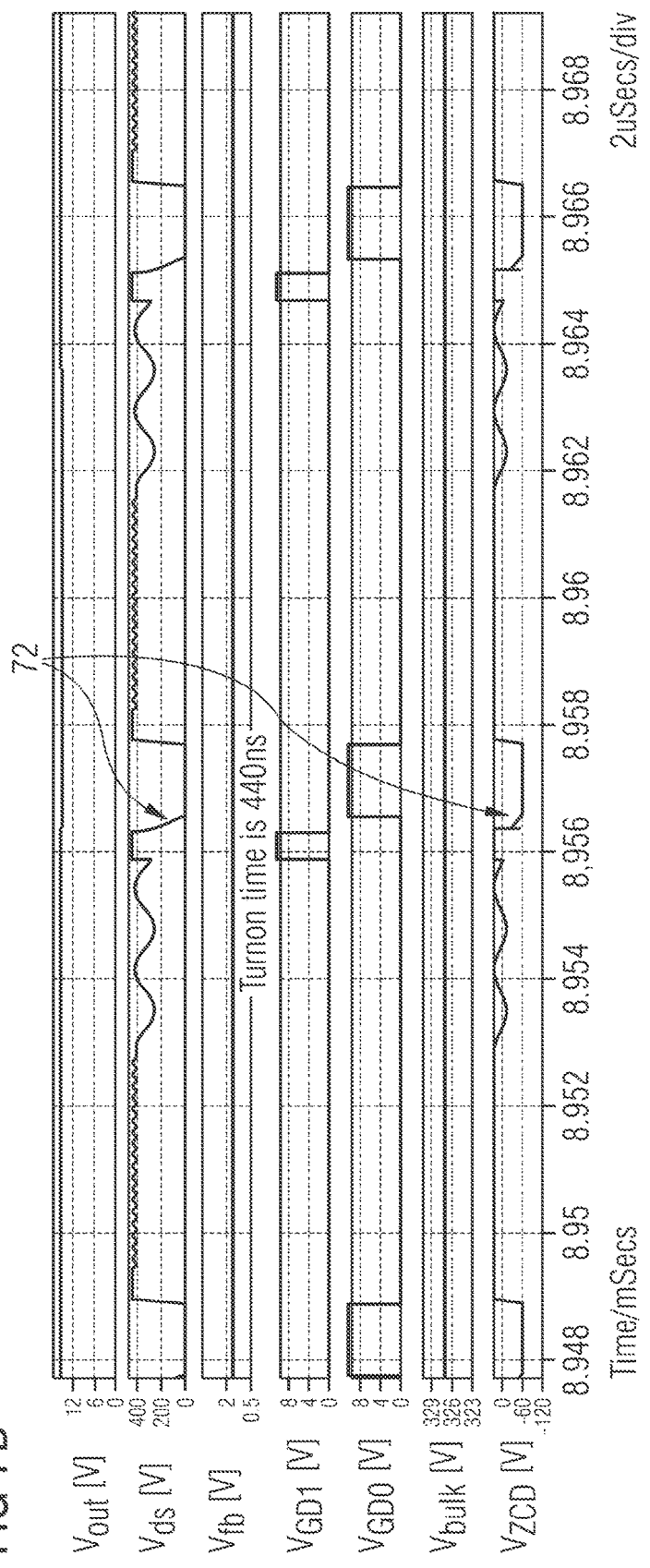

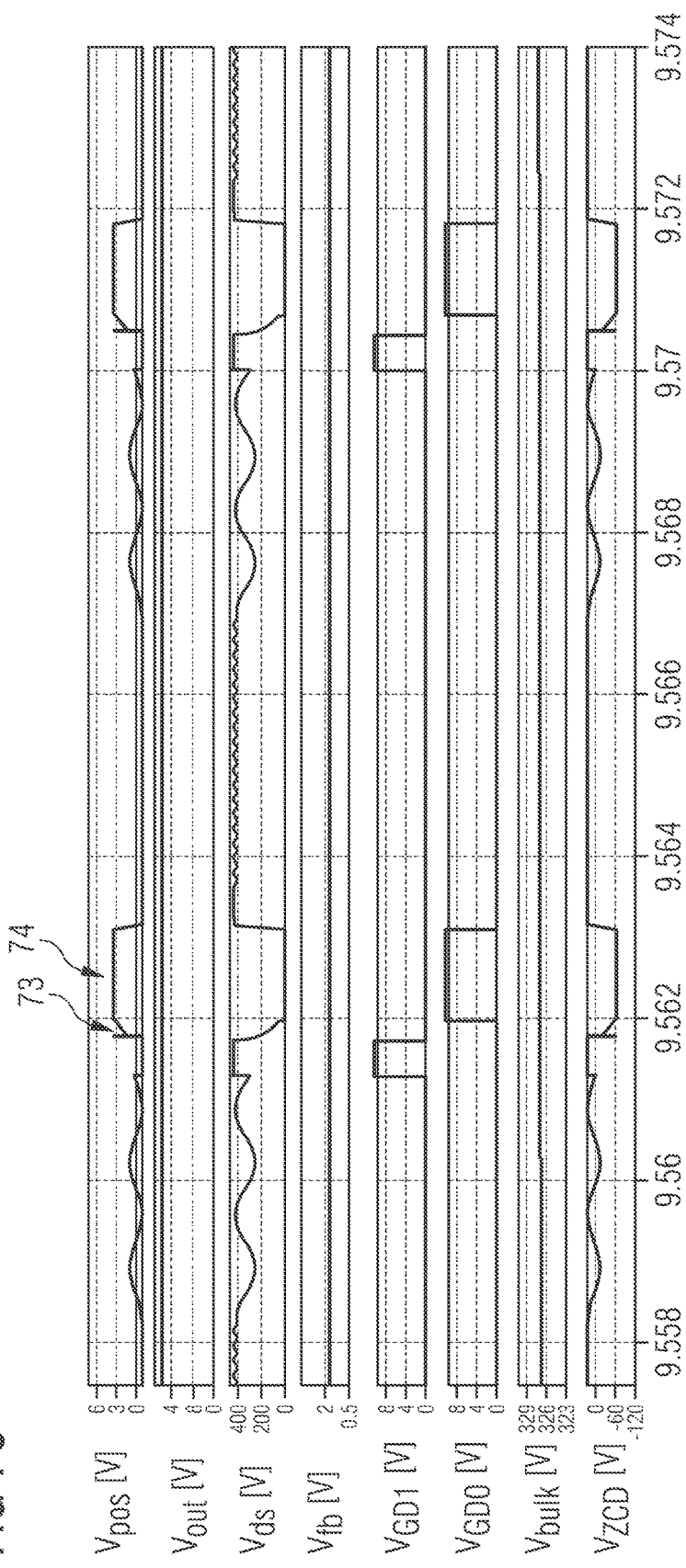

VOLTAGE CONVERTER CONTROLLER, VOLTAGE CONVERTER AND METHOD FOR OPERATING A VOLTAGE CONVERTER

This Application claims priority to German Application Number 102017126696.8, filed on Nov. 14, 2017, the entire content of which is incorporated herein by reference.

TECHNICAL FIELD

The present application generally relates to voltage converters, voltage converter controllers and to corresponding methods.

BACKGROUND

Voltage converters are used to provide an input voltage based on an output voltage. Voltage converters are used for example in power supplies for a variety of applications, for example mobile phones or other electric appliances. Some voltage converters provide galvanic isolation between an input and any output, e.g. by using a transformer. Examples for such voltage converters include flyback converters. A specific type of flyback converter is an asymmetric pulse width modulation (PWM) half-bridge flyback converter, where an inductor of the converter is essentially being split to form a transformer, such that voltage ratios are multiplied based on a winding ratio of the transformer with an additional advantage of providing galvanic isolation.

In some converters, a primary switch is used on a primary side circuit of the converter, i.e. a side coupled to the input to receive the input voltage. A side coupled to the output to output the output voltage is referred to as secondary side circuit herein, and primary side circuit and secondary side circuit may be galvanically isolated from each other. Switches like such a primary switch are often implemented as transistors, for example metal oxide semiconductor (MOS) field effect transistors (FET). In some implementations, such field effect transistors have parasitic capacitances, also referred to as output capacitances herein. If such a switch is switched with a voltage applied across the transistor, the capacitance is charged, and in the switching event this charge may be lost leading to overall losses of the converter.

Therefore, various approaches have been made to obtain so-called zero voltage switching (ZVS), which means that the primary switch is switched, in particular switched on, while no voltage is applied across the switch (for example between source and drain of a MOSFET switch). Such approaches often involve having an auxiliary switch which injects energy such that zero voltage switching is obtained. Timing of controlling such an auxiliary switch is important to on the one hand obtain zero voltage switching and on the other hand prevent energy losses which may result when such an auxiliary switch is closed for a longer time.

In current approaches, an additional pin of a controller controlling the voltage converter to configure and adjust the on-time of such an additional switch is used. Such additional pins increase production costs. Furthermore, current approaches may not provide an optimum timing of an auxiliary switch.

SUMMARY

A voltage converter controller as defined in the independent claims is provided. The dependent claims define further embodiments.

According to an embodiment, a voltage converter controller is provided, comprising:

a drive circuit configured to control switching of a primary switch on a primary side circuit of a voltage controller and of an auxiliary switch for adjusting a switching voltage of the primary switch, a terminal configured to receive a voltage from an auxiliary winding of a transformer of the voltage controller, a sampling circuit configured to provide a first voltage based on the voltage at the terminal before the primary switch is turned on and a second voltage based on the voltage at the terminal while the primary switch is turned on, and an adjustment circuit configured to adjust a turn on-time of the auxiliary switch based on the first voltage and the second voltage.

According to another embodiment, a voltage converter controller is provided, comprising:

a drive circuit configured to control switching of a primary switch on a primary side circuit of a voltage controller and of an auxiliary switch for adjusting a switching voltage of the primary switch, and an adjustment circuit configured to adjust a turn on-time of the auxiliary switch to obtain a switching voltage of the primary switch greater than zero and below an inflection point of a curve of charge stored in an output capacitance of the primary switch versus voltage.

According to another embodiment, a voltage converter is provided, comprising:

a primary side circuit configured to receive an input voltage, a secondary side circuit configured to output an output voltage, a transformer coupling the primary side circuit and the secondary side circuit, wherein the primary side circuit comprises a primary switch, and wherein the voltage converter further comprises an auxiliary switch configured to adjust a switching voltage across the primary switch when the primary switch is turned on, and a voltage converter controller as mentioned above.

According to another embodiment, a method is provided, comprising:

measuring a first voltage using an auxiliary winding of a transformer of a voltage converter before closing a primary switch of a primary side circuit of the voltage controller, measuring a second voltage using the auxiliary winding while the primary switch is turned on, and adjusting an on-time of an auxiliary switch to adjust a switching voltage across the primary switch when the primary switch is turned on based on the first and second voltages.

According to yet another embodiment, a method is provided, comprising:

operating a primary switch of a voltage converter, and adjusting an on-time of an auxiliary switch of the voltage converter to obtain a switching voltage of the primary switch greater than zero and below an inflection point of a curve of charge stored in an output capacitance of the primary switch versus voltage.

The above summary is merely intended to give a brief overview over some aspects of some embodiments and is not to be construed as limiting. In particular, other embodiments may include other features than the ones explicitly given above.

BRIEF DESCRIPTION OF THE DRAWINGS

FIG. 1 is a block diagram of a voltage converter according to an embodiment.

FIG. 2 is a flowchart illustrating a method according to an embodiment.

FIG. 5 is a flowchart illustrating a method according to an embodiment.

FIG. 6 is a signal diagram illustrating operation of the embodiment of FIG. 3.

FIGS. 7A to 7C are signal diagrams illustrating operation of the embodiment of FIG. 3.

DETAILED DESCRIPTION

Figure 3:
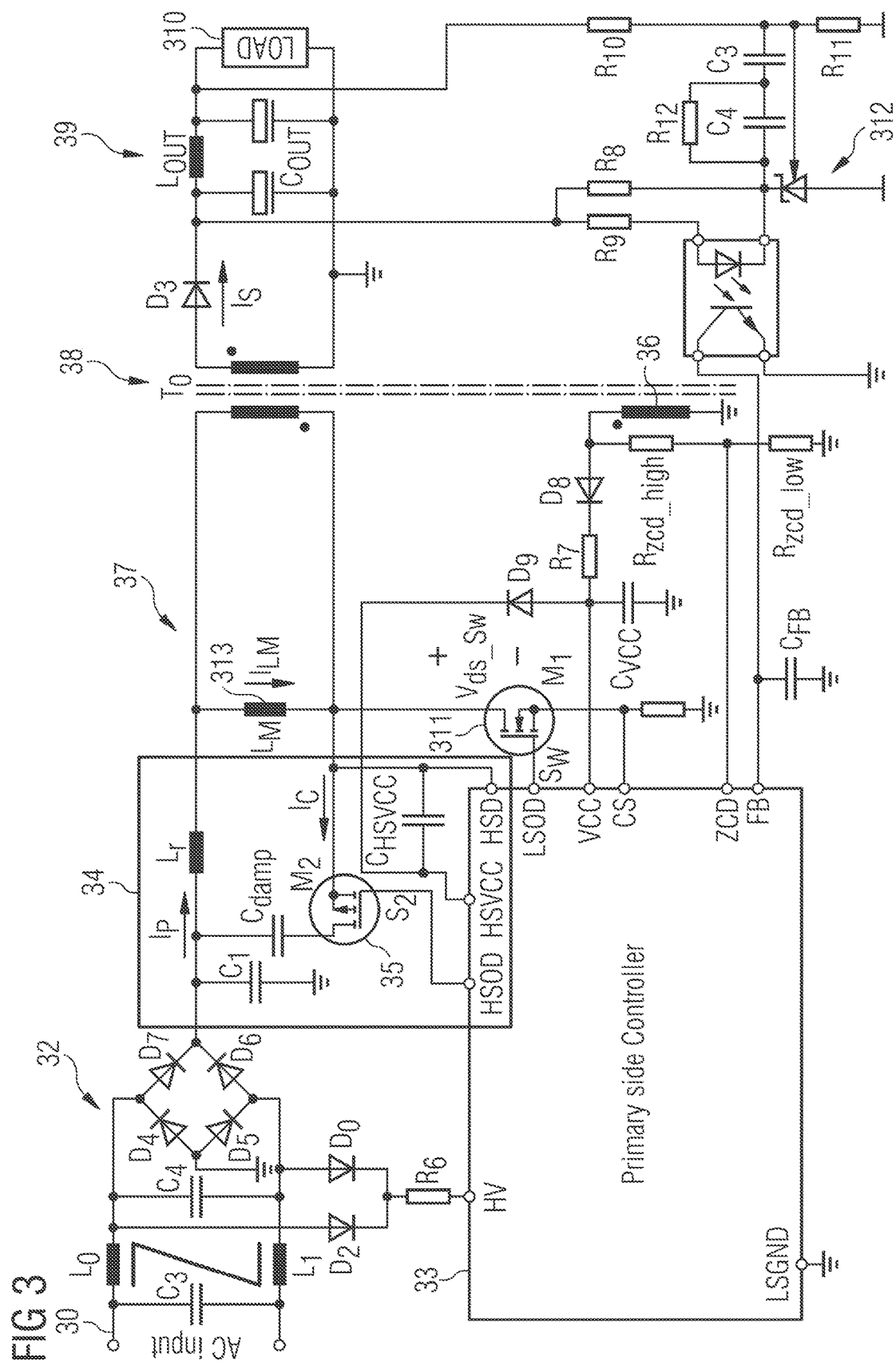
FIG. 3 is a circuit diagram of a voltage converter according to an embodiment.

In the following, various embodiments will be described in detail referring to the attached drawings. These embodiments are given as examples only and are not to be construed as limiting in any way. For example, while embodiments may be described comprising a plurality of features or elements, this is not to be construed as limiting, and in other embodiments, some of the features or elements may be omitted, and/or may be replaced by alternative features or elements. In addition to the features or elements explicitly shown and described, further features or elements, for example features or elements conventionally provided in voltage converters like flyback converters may be provided, for example protection mechanisms like overcurrent protection or feedback control.

Features from different embodiments may be combined with each other to form further embodiments unless noted otherwise. Variations and modifications described with respect to one of the embodiments may also be applicable to other embodiments.

In the embodiments shown and described, any direct electrical connection or coupling between elements, i.e. a connection or coupling without intervening elements (like a metal trace) may be replaced by an indirect connection or coupling, i.e. a connection or coupling comprising one or more additional intervening elements, and vice versa, as long as the general purpose of the connection or coupling, for example to provide a certain kind of signal, a certain kind of information or a certain kind of control, is essentially maintained. In other words, connections are couplings may be modified as long as the general purpose and function of the connection or coupling remains essentially unaltered.

Embodiments relate to voltage converters, controllers for voltage converters and associated methods. While in some of the embodiments described below flyback converters are used as examples for voltage converters, this is merely for illustrative purposes, and other voltage converters, in particular voltage converters providing galvanic isolation by means of a transformer, may be used.

Embodiments described herein use switches, in particular transistor switches. As used herein, a switch is off, in an off state or open when it is essentially non-conducting between its load terminals, for example source and drain terminals in case of a MOS transistor based switch. Essentially non-conducting in this respect means non-conducting apart from possible undesired leakage terminal currents, which may occur in devices. A switch is described as being on, in an on state or closed when it provides a low ohmic connection between its load terminals.

Turning now to the Figures, FIG. 1 illustrates a voltage converter 10 according to an embodiment. The voltage converter of FIG. 1 comprises a primary side circuit 11 receiving an input voltage Vin. Furthermore, the voltage converter of FIG. 10 comprises a secondary side circuit 13 outputting an output voltage Vout. A transformer 12 couples primary side circuit 11 and secondary side circuit 13 while providing galvanic isolation. In some implementations, voltage converter 10 may be a flyback converter.

Furthermore, voltage converter 10 comprises a controller 14 including an adjustment circuit. Controller 14 controls operation of voltage converter 10, in particular by closing a primary switch of the primary side circuit 11 to selectively transfer energy from primary side circuit 11 to secondary side circuit 13. By adjusting an on time of such a primary switch, output voltage Vout may be regulated to a predefined value.

Furthermore, controller 14 controls an auxiliary switch to ensure a switching of the primary switch at a desired voltage across the primary switch, for example at a zero voltage to obtain zero voltage switching, or at a voltage slightly above zero as will be explained further below. This auxiliary switch may be provided on primary side circuit 11 or secondary side circuit 13, as will be explained further below in more detail.

The adjustment circuit of controller 14 measures a first voltage before closing the primary switch and a second voltage while the primary switch is closed. These first and second voltages are indicative of a drain voltage of the primary switch before closing the primary switch and a drain voltage of the primary switch before the primary switch is closed, respectively. As will be explained later in greater detail, based on these voltages an off time (close time) of the auxiliary switch may be adjusted to obtain a switching of the primary switch at a desired voltage. The voltage across the primary switch when the primary switch switches, e.g. is turned on (closed), is also referred to as switching voltage herein.

FIG. 2 illustrates a flowchart of a method according to an embodiment. While the method of FIG. 2 is shown and illustrated as a series of acts or events, the order in which these acts or events are described is not to be construed as limiting. The method of FIG. 2 may be implemented using the voltage converter of FIG. 1, in particular controller 14 thereof, but may also be implemented independently therefrom.

At 20, the method comprises measuring a first voltage before closing a primary switch of a voltage converter using an auxiliary winding of a transformer of the voltage converter. The first voltage may be indicative of a drain voltage of the primary switch while closing the primary switch. "Indicative of" means that the measured voltage need not be the drain voltage itself, but some voltage that varies with the drain voltage so it may serve as an indication thereof.

The term "before closing" may indicate a measurement a short time before closing, e.g. immediately before or when a control signal is provided to the primary switch to close the primary switch.

At 21, the method comprises measuring a second voltage while the primary switch is closed using the auxiliary winding. The second voltage may be indicative of a DC link voltage while the primary switch is closed. In some embodiments, as will be described below in more detail, the first and second voltages may be measured using an auxiliary winding coupled to transformer 12.

At 22, the method comprises adjusting an on time of an auxiliary switch based on the first and second voltages to adjust a voltage at which the primary switch switches to a predefined value, for example to 0 V or a value slightly above 0 V. Examples will be described further below in more detail.

Next, specific examples for voltage converters where the techniques discussed above may be implemented and implementation examples therefore will be discussed. These serve only illustrative purposes and are not to be construed as limiting.

FIG. 3 is a circuit diagram of a voltage converter, in this case a flyback converter, according to an embodiment. The voltage converter of FIG. 3 receives an input voltage on a primary side circuit 37 and outputs an output voltage to a load 310 by a secondary side circuit 39. Primary side circuit 37 and secondary side circuit 39 are coupled by a transformer 38. In the embodiment of FIG. 3, primary side circuit 37 receives the input voltage as an AC (alternating current) input voltage at terminal 30 and rectifies this AC voltage via a rectifier 32 to obtain DC (direct current) input voltage.

Primary side circuit 37 comprises a primary switch 311 which is controlled by a primary side circuit controller 33. Primary side circuit controller 33 controls primary switch 311, for example according to a pulse width modulation (PWM) control scheme, to regulate an output voltage provided to load 310 to a predefined value. For this, primary side circuit controller 33 receives information indicative of the output voltage via a feedback loop 312.

Furthermore, the voltage converter of FIG. 3 comprises an active clamp 34 including an auxiliary switch transistor 35 and coupled to an inductivity 313. By turning on auxiliary transistor 35 prior to turning on primary switch 311, a voltage across primary switch 311 when primary switch 311 is turned on may be adjusted, for example to be at about 0 V to obtain zero voltage switching or to be slightly above 0 V to further optimize energy losses as will be explained further below.

Furthermore, the voltage converter of FIG. 3 comprises an auxiliary transformer winding 36 coupled to primary side circuit controller 33. Via auxiliary winding 306, primary side circuit controller 33 may measure voltages indicative of a drain voltage of primary switch 311 and may adjust switching of auxiliary switch 35, according to techniques as discussed with reference to FIGS. 1 and 2 and as will be further discussed with reference to FIGS. 4 to 7. In this way, operation of active clamp 34 may be adjusted to obtain a desired voltage across primary switch 311 when primary switch 311 is turned on.

Figure 4:
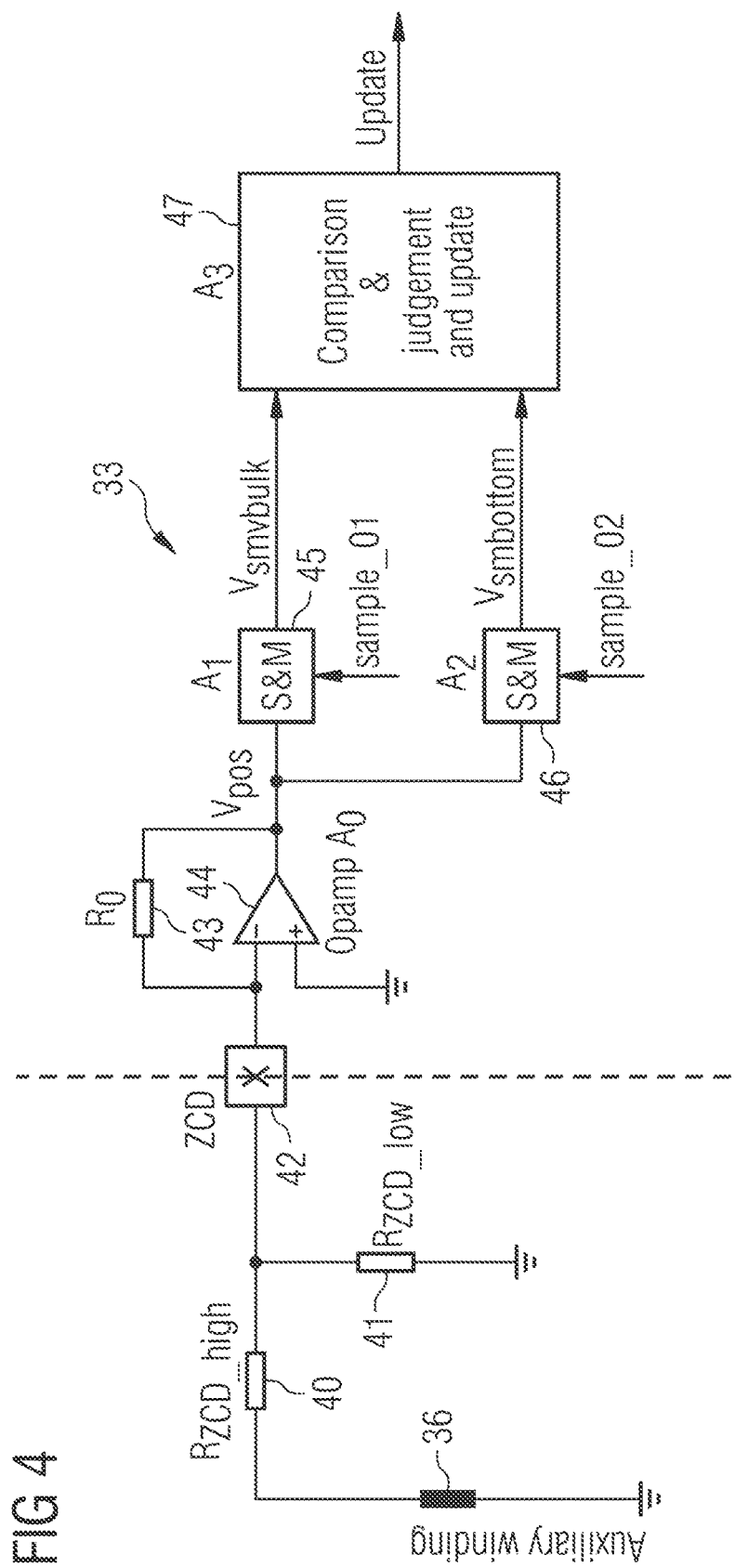
FIG. 4 is a circuit diagram illustrating an adjustment circuit of a voltage converter controller according to an embodiment.

FIG. 4 is a circuit diagram illustrating part of primary side circuit controller 33 according to an embodiment, in particular an adjustment circuit thereof. Auxiliary winding 36 of FIG. 3 is coupled to a terminal 42 (for example pin) of primary side circuit controller 33. Terminal 42 is also referred to as zero crossing detection (ZCD) terminal.

As shown in FIG. 4, in this embodiment auxiliary winding 36 is coupled to terminal 42 via a resistor 40 $R_{ZCD\_high}$, and a resistor 41 $R_{ZCD\_low}$ couples a node between resistor 40 and terminal 42 to ground.

Auxiliary winding 36 together with resistors 40, 41 allows to detect a voltage indicative of a drain voltage of primary switch 311 during operation of the voltage converter. The voltage $V_{bulk}$ (input voltage after rectifier 32 corresponding to drain voltage) is reflected through the auxiliary winding 36 to ZCD terminal 42 and therefore may be measured. When primary switch 311 is turned on, the voltage thus provided to terminal 42 is a negative voltage. In the embodiment of FIG. 4, an inverter formed by an operational amplifier 44 with a feedback resistor 43 converts this negative voltage to a positive voltage $V_{pos}$. In other embodiments, the negative voltage may be used without conversion to a positive voltage.

The positive voltage $V_{pos}$ is sampled in a first sampling circuit 45 and a second sampling circuit 46. Sampling circuits 45, 46 may for example be implemented as latches or flipflops. First sampling circuit 45 is controlled by a signal sample_01 to sample $V_{pos}$ before primary switch 311 is turned on. The sampled voltage is referred to as $V_{smvbulk}$ herein. Second sampling circuit 46 is controlled by a signal sample_02 to sample voltage $V_{pos}$ before the primary switch 311 is turned on. This sampled voltage is referred to as $V_{smbottom}$ herein. A comparison, judgment and update logic circuit 47 processes voltages $V_{smvbulk}$, $V_{smbottom}$ and updates a turn-on time of second auxiliary switch 35 based on the comparison.

In particular, circuit 47 may compare a difference between $V_{smvbulk}$ and $V_{smbottom}$ to threshold values to determine if a turn-on time of auxiliary switch 35 should be increased, decreased our may stay the same.

For example, in an embodiment, if $V_{smvbulk}-V_{smbottom}$ is greater than a first reference voltage $V_{ref1}$, this may indicate that the turn-on time of auxiliary switch 35 has to be increased. For example, this may indicate that primary switch 311 is turned on at a non-zero voltage, and the turn-on time of auxiliary switch 35 is increased to ensure zero voltage switching. In other embodiments, switching at another predefined voltage may be obtained as discussed later.

If $V_{smvbulk}-V_{smbottom}$ is below a second reference voltage $V_{ref2}$, this may indicate that the primary switch 311 is turned on at the correct switching point, for example at zero voltage, but that the turn-on time of auxiliary switch 311 may be unnecessarily long. A longer turn-on time than needed may lead unnecessary losses. Therefore, in this case, in embodiments the on-time of auxiliary switch 35 may be reduced.

If $V_{ref2}<V_{smvbulk}-V_{smbottom}<V_{ref1}$, this means that the primary switch 311 is switched on at a desired voltage (for example zero voltage), such that the turn-on time of auxiliary switch 35 need not be modified. $V_{ref1}$ and $V_{ref2}$ are selected based on the desired switching voltage for primary switch 35, for example to ensure zero voltage switching or switching at a voltage slightly above zero. Turn-on time of auxiliary switch 35 may be modified for example by changing a pulse width of a pulse width modulated signal controlling auxiliary switch 35. Example signals will be discussed further below in more detail.

The operation of the embodiment of FIG. 3 is as follows:

When auxiliary switch 35 is turned on, a clamp voltage across a clamp capacitor of active clamp 34 is discharged to magnetize an output induction of active clamp 34. When auxiliary switch 35 is turned off again, the remaining current will continue to discharge the drain voltage of primary switch 311 from $V_{in}+n_P/n_S \times V_{out}$ to 0, wherein $V_{in}$ is the input voltage after rectification (after rectifier 32), $V_{out}$ is the output voltage and $n_P/n_S$ is the winding ratio between primary and secondary side circuit of transformer 38. The corresponding voltage as seen at ZCD terminal 42 of FIG. 2 when primary switch 311 is turned on is $-V_{bulk} \times n_A/n_P \times (R_{ZCD\_low}/R_{ZCD\_low}+R_{ZCD\_high})$, wherein $n_A/n_P$ is the winding ratio between auxiliary winding 36 and the primary winding of transformer 38. To achieve the zero voltage switching, for example the energy stored in the magnetizing inductance should be larger than $\frac{1}{2} \times C_{OSS} \times V_{DS}^2$, where $V_{DS}$ is the drain source voltage of primary switch 311, and $C_{OSS}$ is the output capacitance of primary switch 311.

Therefore, by turning the auxiliary switch on for a short time, the drain source voltage of primary switch 311 is discharged before primary switch 311 is turned on to a desired level.

During turning on of primary switch 311, the voltage at terminal 42 will be negative as explained above at $-V_{bulk} \times n_A/n_P \times (R_{ZCD\_low}/R_{ZCD\_low} + R_{ZCD\_high})$. The drain source voltage of primary switch 311 before primary switch 311 is turned on depends on the length of the on-time of auxiliary switch 35. By setting the above threshold $V_{ref1}$ and $V_{ref2}$ accordingly, a turn-on time necessary for zero voltage switching or another desired switching voltage may be obtained.

To further illustrate, FIG. 5 is a flowchart illustrating a method according to an embodiment. The method of FIG. 5 may be implemented in the embodiments of FIGS. 3 and 4, in particular using primary side circuit controller 33, and will be explained with reference to FIGS. 3 and 4 for ease of illustration. However, use of the method of FIG. 5 is not limited to the embodiments of the FIGS. 3 and 4.

The method of FIG. 5 is illustrated as a series of acts or events and may be part of a continuous operation of a voltage converter. Therefore, as will be explained below in more detail, the acts or events described in the following with reference to FIG. 5 may be performed repeatedly.

At 50 in FIG. 5, the method comprises turning on a main power MOSFET acting as primary switch, for example primary switch 311 of FIG. 3.

At 51, the method comprises sampling the voltage at the ZCD terminal (or a voltage derived therefrom, for example $V_{pos}$ at FIG. 4) while the power MOSFET is turned on. In the embodiment of FIG. 4, this is done by controlling sampling circuit 45.

After this, the main power MOSFET is turned off.

At 52, when a voltage at terminal 42 has a highest (peak) value, an auxiliary power MOSFET, for example of an active clamp, like auxiliary switch 35 in FIG. 3, is turned on with a fixed pulse width control signal resulting in a fixed turn-on time. This, as explained above, reduces the voltage across the main power MOSFET.

At 53, the method comprises sampling and holding the voltage at the ZCD terminal, which is again the reflected drain voltage or bulk voltage. The bulk voltage (sometimes referred to as $V_{bulk}$) is the voltage across a capacitor C1 in FIG. 3 or $C_{BULK}$ in FIG. 8. The drain voltage, sometimes referred to as $V_{drain}$ is the voltage across the main switch, e.g. switch 311 of FIG. 8. This sampling at 53 in the embodiment of FIG. 4 is performed by sampling circuit 46.

The results of the samplings at 51 and 53 are processed at 56 as explained above, for example by comparing a difference of the sampling results at 51 and 53 with reference voltages like $V_{ref1}$, $V_{ref2}$ mentioned above. Based on the comparison, the turn-on time of the auxiliary power MOSFET is modified, for example by modifying the pulse width of a corresponding control signal.

And 55, the main power MOSFET is again turned on after a certain dead time after opening the auxiliary power MOSFET. 54 is a repetition of 50 in the next cycle, so that, as indicated at 55, the method is repeated.

Next, operation of the embodiment of FIGS. 3 and 4 and the method of FIG. 5 will be further illustrated using example signals.

It should be noted that signal waveforms illustrated herein serve merely as illustrative examples, and signal waveforms may vary depending on a specific device implementation.

In FIG. 6, $V_{gs}$ denotes a gate-source voltage. Portions labeled $S_A$ illustrate a gate-source voltage applied for closing auxiliary switch 35 of FIG. 3, and portions labeled $S_w$ illustrate a gate-source voltage applied to close primary switch 311. Currents $I_p$, $I_{Lm}$, $I_c$ and $I_s$ are shown in FIG. 3 and denote a primary side circuit current, a current through inductivity 313, a current through auxiliary switch 35 and a secondary side circuit current, respectively. $V_{ds\_Sw}$ denotes a drain-source voltage of primary switch 311. A box 60 illustrates the behaviour prior to turning on primary switch 311. By closing auxiliary switch 35, the drain source voltage $V_{ds\_Sw}$ is brought to zero at a time when primary switch Sw is turned on (time $t_8$ in FIG. 6). In other embodiments, the on-time of secondary switch 35 is used to provide a switching at a drain-source voltage $V_{ds\_Sw}$ slightly above zero, as will be discussed later.

FIGS. 7A to 7C are waveform diagrams further illustrating the operation outlined above. In FIGS. 7A to 7C, $V_{pos}$ is the voltage $V_{pos}$ of FIG. 4, $V_{ZCD(V)}$ is the voltage at terminal 42 ($V_{pos}$ is essentially $-V_{ZCD}$), $V_{out}$ is an output voltage of the voltage converter, $V_{ds}$ is the drain-source voltage of primary switch 311, $V_{fb}$ is a feedback voltage provided by feedback loop 312, $V_{GD1}$ illustrates a control voltage applied to auxiliary switch 35, $V_{GD0}$ illustrates a control voltage applied to primary switch 311 (gate-source-voltages, respectively), and $V_{bulk}$ corresponds to the already mentioned voltage $V_{bulk}$ shown in FIG. 3. FIG. 7A illustrates a case where the turn-on time of auxiliary switch 35 is too short for zero voltage switching, such that some drain-source voltage $V_{ds}$ remains when the primary switch is turned on according to voltage $V_{GD0}$. Reference numeral 70 illustrates a point in time where the voltage $V_{pos}$ is sampled prior to turning on the switch to obtain the voltage $V_{smbottom}$ (sampling circuit 46 of FIG. 4, 53 of FIG. 5), and reference numeral 70 indicates a point in time where the voltage $V_{pos}$ is sampled during the primary switch is on (sampling circuit 45 of FIG. 4 to obtain $V_{smvulk}$, 51 of FIG. 5). Based on the thus sampled voltages, if zero voltage switching were to be obtained based on the voltages in FIG. 7A the pulse width of signal $V_{GD1}$ would be increased.

For example, this may lead to the situation of FIG. 7B, where the drain-source voltage is zero at turning the primary switch on, as indicated by reference numeral 72.

Just to give a non-limiting example, in FIG. 7A the turn-on time of the auxiliary switch may be 225 ns, which may be increased to 440 ns in FIG. 7B.

FIG. 7C shows a situation where the turn-on time of the auxiliary switch is further increased. Reference numeral 73 and 74 indicate sampling points corresponding to reference numerals 70 and 71, respectively, in FIG. 7A, i.e. sampling before turning on the primary switch and sampling while the primary switch is turned on. While also in case of FIG. 7C zero voltage switching is achieved, the comparatively long turn-on time of auxiliary switch 35 leads to additional losses compared to FIG. 7B.

In this case, the update by comparison and judgement and update circuit 47 and/or the comparison and judgement at 56 in FIG. 5 would result in a decrease of turn-on time of auxiliary switch 35.

Above, an embodiment has been described where an auxiliary switch in an active clamp is used to provide switching of a primary switch at a desired voltage, for example zero voltage switching. In other embodiments, other arrangements of auxiliary switches may be used to provide switching of a primary switch at a desired voltage, for example zero voltage switching. Examples for such alternative arrangements will be described next referring to FIGS. 8 to 10.

Figure 8:
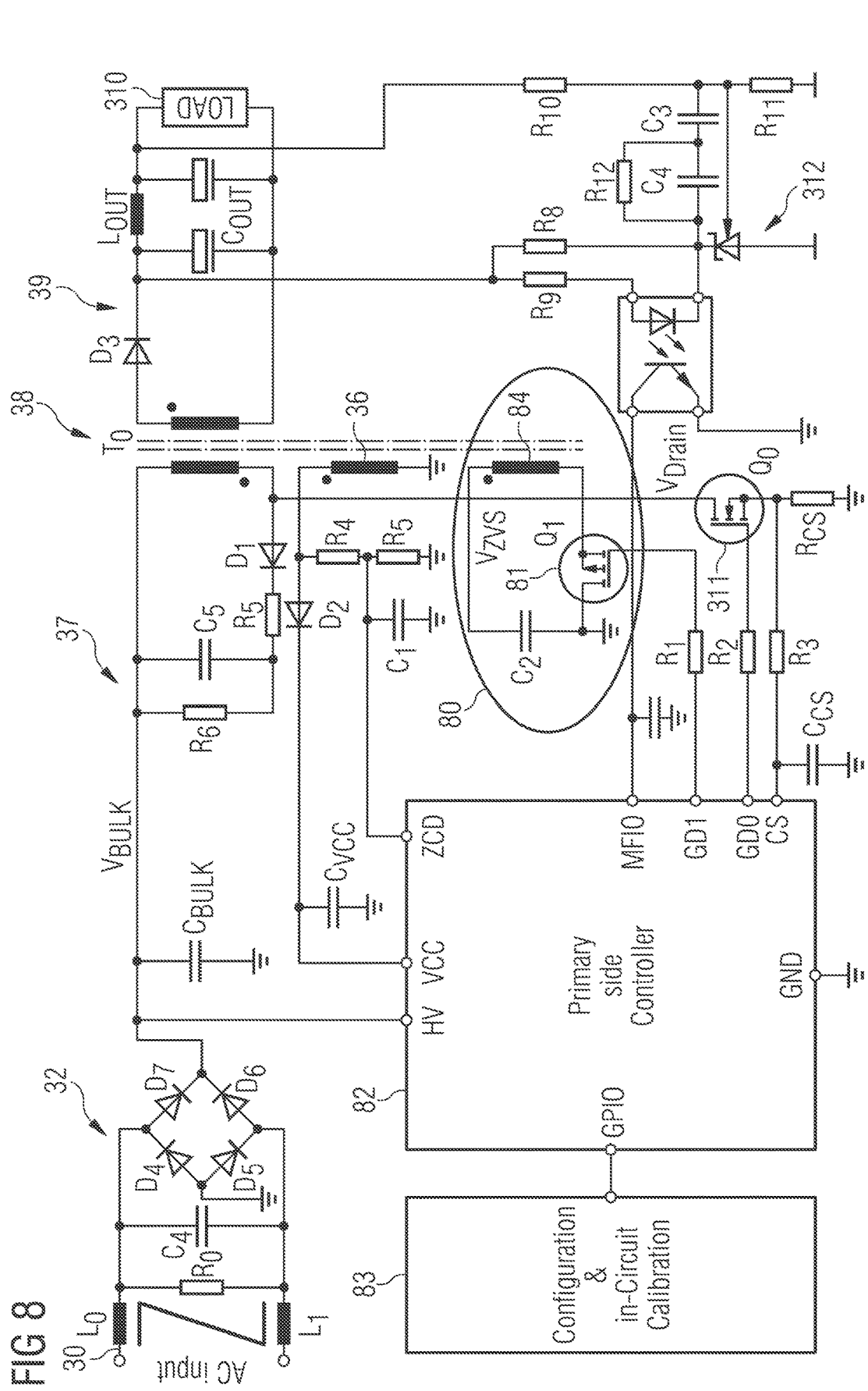
FIG. 8 is a circuit diagram of a voltage converter according to a further embodiment.

FIG. 8 illustrates a voltage converter according to a further embodiment. In order to avoid repetitions, elements of the voltage converter of FIG. 8 which corresponds to the voltage converter of FIG. 3 bear the same reference numerals and will not be discussed again in detail.

Instead of active clamp 34 of FIG. 3, the voltage converter of FIG. 8 comprises an additional auxiliary winding 84 coupled to an auxiliary switch 81. A primary side circuit controller 82, which performs similar functions as described primary side circuit controller 33 of FIG. 3, controls switching of primary switch 311 and auxiliary switch 81. In particular, by closing auxiliary switch 81 prior to closing primary switch 311, switching of primary switch 11 at a desired voltage, for example zero voltage switching, may be obtained.

To this end, primary side circuit controller 82 samples voltages received at terminal 42 using auxiliary winding 36, for example by using a circuit as shown in FIG. 4. In other words, an on-time of auxiliary switch 81 may be adjusted as has been explained for the on-time of auxiliary switch 35 above.

Additionally, in the embodiment of FIG. 8 primary side circuit controller 82 may be configured and calibrated using a configuration and in circuit calibration circuit 83 in any conventional manner. In other embodiments, configuration and calibration circuit 83 may be omitted, and/or such a calibration circuit may be provided for primary side circuit controller 33.

Figure 9:
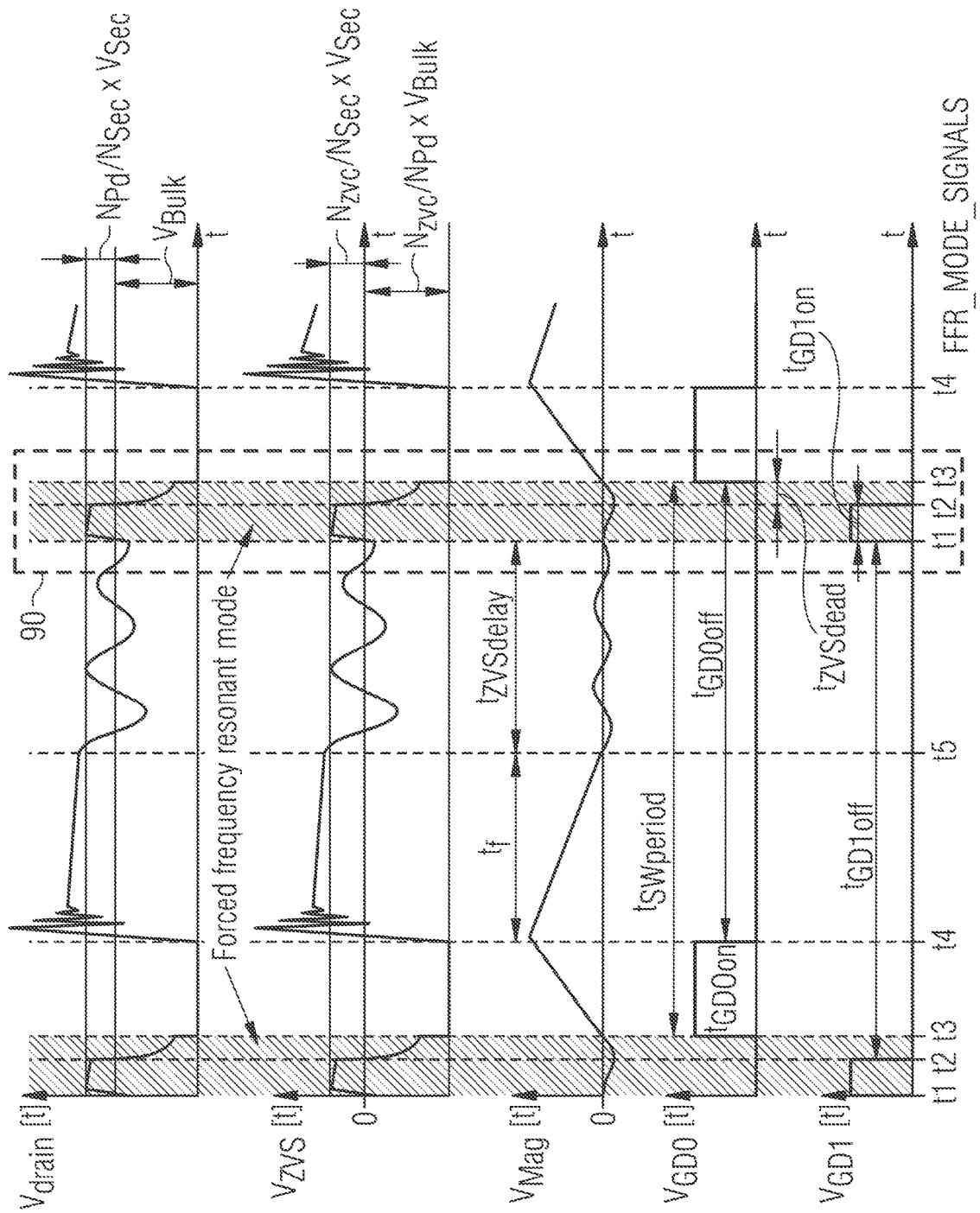
FIG. 9 is a signal diagram illustrating operation of the embodiment of FIG. 9.

FIG. 9 shows an example operation of the embodiment of FIG. 8. In FIG. 9, $V_{GD1}$ illustrates a control signal applied to auxiliary switch 81, and $V_{GD0}$ illustrates a control voltage applied to a gate terminal of primary switch 311. As for example shown in a box 90, prior to turning on primary switch 311, auxiliary switch 81 is turned on for a short duration. This induces a discharge at auxiliary winding 84 as indicated by a voltage $V_{ZVS}$ in FIG. 9. The current in the auxiliary winding creates a negative current in the magnetizing inductance, which in turn discharges the drain voltage $V_{drain}$ of primary switch 311, such that in the example of FIG. 9 zero voltage switching may be obtained. $I_{mag}$ illustrates the magnetizing current.

Therefore, also by using an additional auxiliary winding 84 coupled to auxiliary switch 81, switching of a primary switch at a desired voltage may be obtained, for example zero voltage switching.

Figure 10:
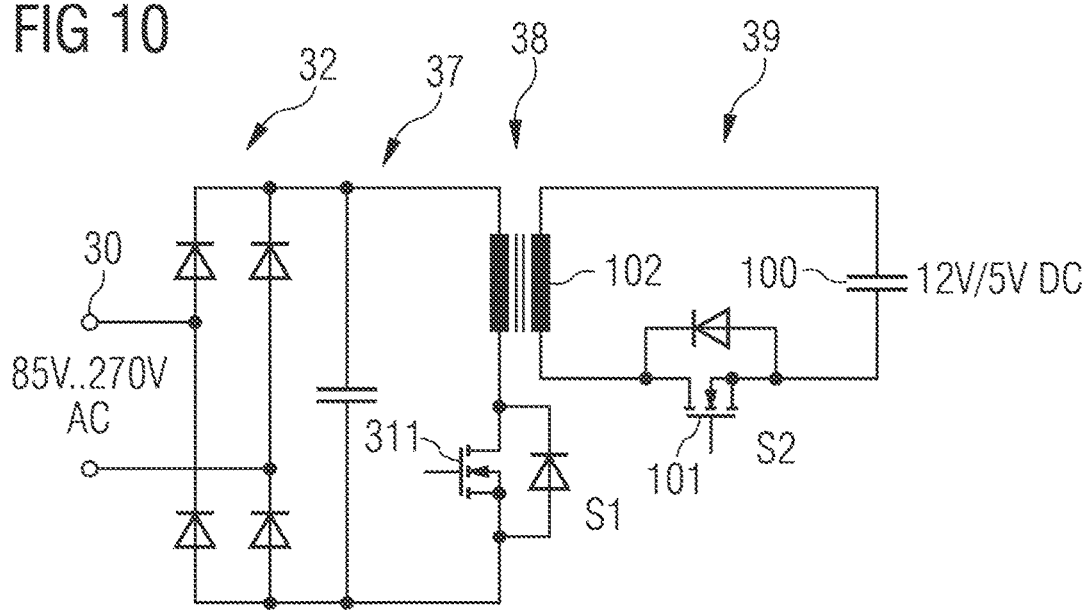
FIG. 10 is a schematic representation of a voltage converter according to a further embodiment.

FIG. 10 schematically illustrates part of a voltage converter according to a further embodiment. Again, elements already discussed with reference to FIGS. 3 and 8 bear the same reference numerals and will not be discussed again. Moreover, FIG. 10 illustrates only some components of the voltage converter, and other components like feedback 312 and primary side circuit controller 33 or 82 and auxiliary winding 36 have been omitted in FIG. 10, but may be implemented in the same manner as discussed referring to FIGS. 3, 4 and 8. In FIG. 10, an auxiliary switch 101 is provided on secondary side circuit 39 coupled to a voltage source 100 and a secondary side winding 102. By closing switch 101, energy is injected from secondary side circuit 39 to primary side circuit 37, which again may serve to discharge a voltage across primary switch 311 to ensure switching at a desired voltage. In a similar manner as has been explained above, an on-time of auxiliary switch may be regulated based on voltage measurements as explained with reference to FIGS. 4 and 5 to obtain switching of primary switch 311 at a desired voltage, for example zero voltage switching.

Therefore, as can be seen, techniques discussed herein may be applied to a variety of architectures in voltage converters to adjust a turn-on time of an auxiliary switch, either at a primary side circuit are a secondary side circuit, to obtain a desired switching voltage for a primary switch, for example zero voltage switching.

As explained above, in some embodiments zero voltage switching is obtained. In other embodiments, switching at a voltage slightly above zero may be obtained to optimize overall losses, as will now be explained referring to FIGS. 11 to 13.

In particular, obtaining zero voltage switching across a primary switch like primary switch 11 requires energy, for example energy injected from a secondary side circuit as in FIG. 10, energy used due to active clamping as in FIG. 3 or energy for using an additional auxiliary winding as in FIG. 8. As will be discussed below, in some embodiments overall energy losses may be optimized by selecting a switching voltage of the primary switch not exactly at 0 V, but slightly above 0 V.

In some embodiments, auxiliary switch 101 on secondary side circuit 39 may be a synchronous rectification switch of a synchronous rectifier, which is used in this embodiment to obtain a desired switching voltage on the primary side circuit.

Figure 11:
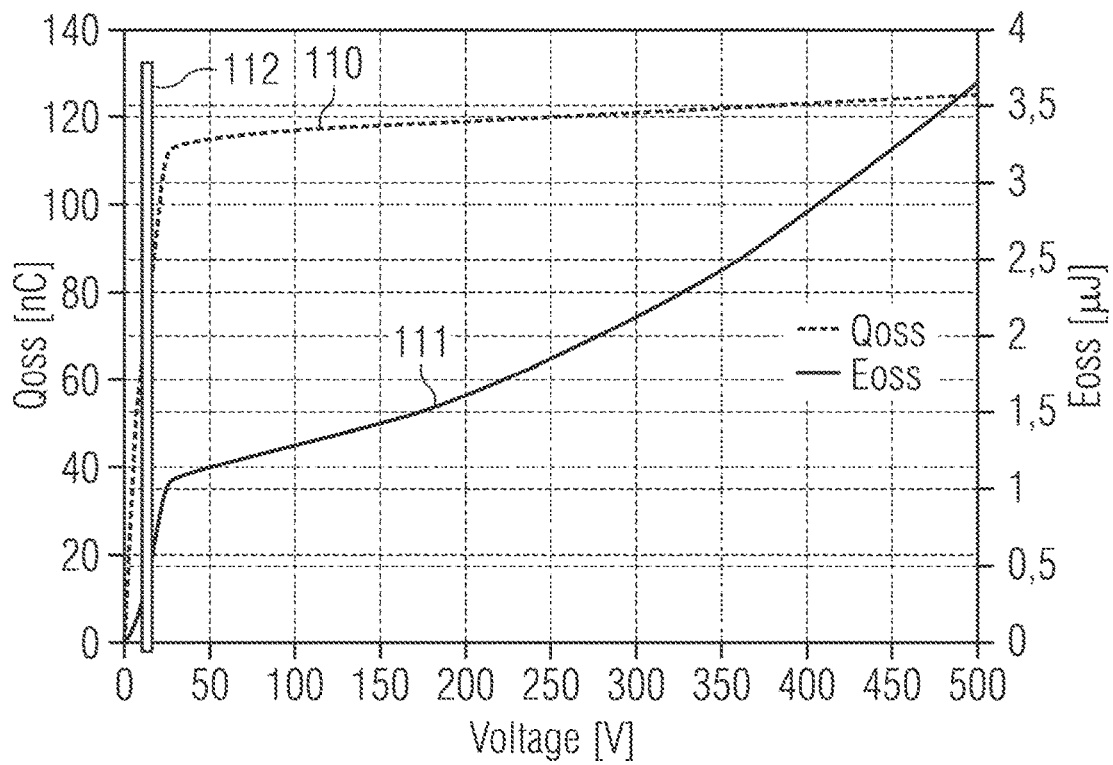
FIGS. 11 to 13 are diagrams illustrating selection of a switching voltage according to some embodiments.

FIG. 11 illustrates charge and energy in an output capacitance of a primary switch (e.g. the parasitic capacitance mentioned above), in this example a superjunction power switch, for various switching voltages. In particular, a curve 110 shows the stored charge Qoss, and a curve 111 shows the stored energy Eoss over voltage across the primary switch. As can be seen in FIG. 1, injecting about 10% of the maximum charge Qoss into the primary switch lowers the voltage from 500 V down to 28 V. This charge/discharge needs to be generated through closing the auxiliary switch. In this case, for example 90% of losses can be saved if the device is discharged to 28 V only instead of discharging down to 0 V, and the energy stored in the output capacitance is reduced by more than two thirds in this part case, as indicated by a bar 112.

In particular, as can be seen in FIG. 11 at lower voltages (slightly below 25 V in FIG. 11) there is a sharp bend in curves 110 and 111, where the slope of the curve may vary strongly, e.g. by more than 20%. This bend is also referred to as inflection point or region herein. The inflection point may be defined as a voltage where a first derivative p=d (Ron*Qoss)/dV corresponds to a predefined threshold, for example 0.1, where Ron is the on resistance of the primary switch. In other words, parameter p is the first derivative of the product of Ron and Qoss. This parameter p decreases monotonically from 2.3 towards 0.003 in the voltage interval 0V to 500V. Following this definition, the inflection point for FIG. 11 is at 26.5V.

Figure 12:
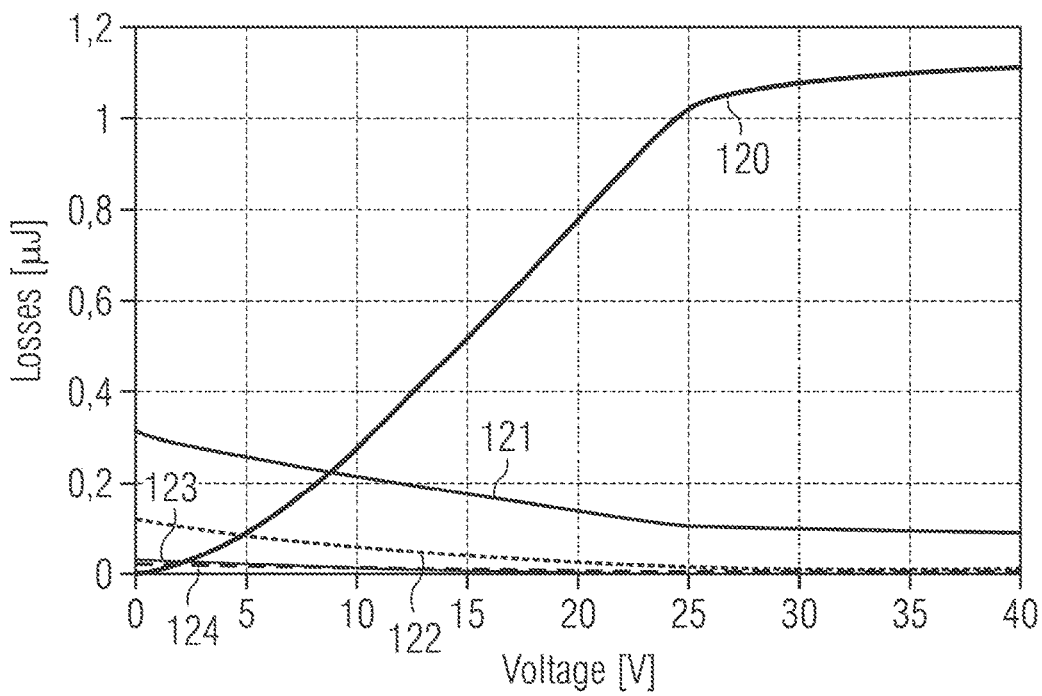

FIG. 12 illustrates a further example taking into account various conduction losses. For the example of FIG. 12, it is assumed that energy is injected using a synchronous rectification switch as explained with reference to FIG. 10.

Figure 13:
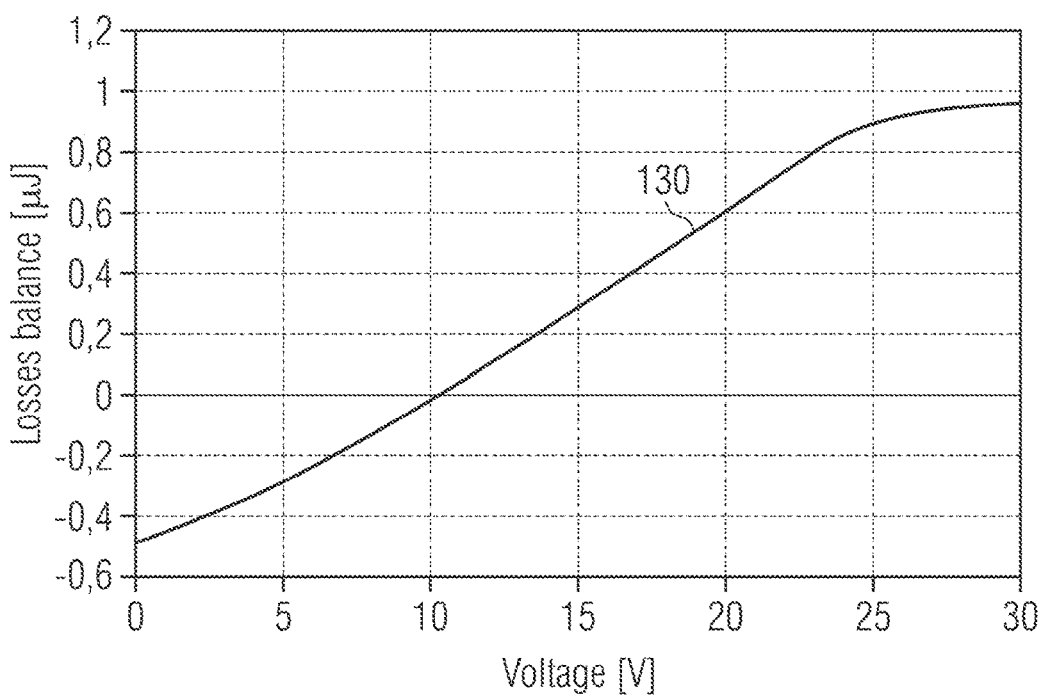

In FIG. 12, a curve 120 illustrates a loss of energy stored in the primary switch (Eoss loss) as explained already with respect to FIG. 11, which is zero for zero voltage switching. A curve 121 illustrates additional switching losses on a secondary side circuit, which result from turning off current through a synchronous rectification switch on the secondary side circuit, a curve 122 shows conduction losses on the second side from positive currents, a curve 123 shows conduction losses on the secondary side circuit due to additional negative (synchronous rectified) currents, and a curve 124 shows additional primary conduction losses due to slightly higher peak currents on the primary side. All the losses are plotted over a voltage across the primary switch when the primary switch is turned on. As can be seen, while the loss according to curve 120 is zero at 0 V, the other losses have their highest value at 0 V and then decrease towards higher voltages as energy is needed to achieve zero voltage switching FIG. 13 shows a loss balance, with zero loss balance indicating the minimum overall losses taking all losses of FIG. 12 together. As can be seen, the lowest losses are not at a switching voltage at 0 V, i.e. zero voltage switching, but at a slightly higher voltage, about 10 V in the example of FIG. 13. Switching at 0 V creates 0.5 µJ more losses than this optimum point, whereas switching at the inflection point of FIG. 11 (about 26 V in the example of FIG. 11) creates 0.9 µJ higher losses for each switching event. The optimum switching voltage is hence roughly half way between zero Volt and the inflection point, for example between 30% and 70% of the voltage at the inflection point or between 40% and 60% of the voltage at the inflection point.

While energy injection from the secondary side circuit as illustrated with respect to FIG. 10 has been used as an example in FIGS. 12 and 13, similar considerations apply to other arrangements, for example the arrangements discussed referring to FIGS. 3 and 8. Essentially, by all these methods an output capacitance of the primary switch is charged/discharged.

Besides the aspects of losses, in some embodiments using a switching voltage slightly above 0 V may also be advantageous in terms of loss of duty cycle in some embodiments, as injecting too much energy, for example to discharge the primary switch entirely to 0 V, takes more duty cycle and in some cases may lead to controller limitations with respect to a dead time needed to allow discharging of an output capacitance of the primary switch.

It should be noted as the Qoss curve at least for modern superjunction power switches is comparatively flat for voltages higher than the inflection point, the optimum switching voltage discussed with reference to FIG. 13 basically does not vary with the input voltage of the voltage converter, for example discharging from 500 V of from 200 V does essentially not change the optimum switching voltage, which in both cases lies between 10 and 11 V for the example switch discussed with reference to FIGS. 11-13. While specific values argument with respect to FIGS. 11-13, these values depend on the specific switch implementation.

In other embodiments, where the behavior of the Qoss curve like curve 110 in FIG. 11 is less pronounced, i.e. without a strong inflection and with steeper slope for higher voltages, a shift in the optimum voltage depending on input voltage may occur. For example, at a lower input voltage the switching voltage may be adjusted to a lower volt value than for higher input voltages. The exact optimum voltage, i.e. voltage wherever losses are minimized, generally depends on the topology, the on resistances of primary and secondary side circuit switches, peak currents on primary and secondary side circuit etc.

Furthermore, conduction losses on the primary side circuit and conduction losses from positive currents on the secondary side circuit (see FIG. 12) comprise a linear term depending on the load current on primary and secondary side circuit, respectively. Due to this, there is a slight load dependency on the optimum voltage, to higher voltages with increasing load, as the Eoss losses (curve 120) remain the same independent of load current. In some embodiments, therefore the switching voltage may be adjusted depending on load current. In other embodiments, the switching voltage may remain constant independent of load current. It should further be noted that in embodiments no adjustment to the optimum value is necessary, but a value between the inflection point of the Qoss/Eoss curves and 0 V may be selected which for example may be only approximately at the optimum.

It should be noted that while the setting of the switching voltage of the primary side switch to a voltage between zero and the inflection point as explained above may be performed using the control techniques discussed above, i.e. using two voltages measured using an auxiliary winding, it may also be used in conjunction with other control techniques, for example conventional techniques.

As has been explained above, the concept is applicable to various converter topologies, for example as explained with reference to FIG. 3, 8 or 10, where a voltage across a primary switch is actively lowered by injecting energy using an auxiliary switch.

Therefore, the specific implementations discussed above serve only as examples and are not to be construed as limiting in any way.

At least some of the embodiments are defined by the examples given below.

Example 1

A voltage converter controller, comprising:
a drive circuit configured to control switching of a primary switch on a primary side circuit of a voltage controller and of an auxiliary switch for adjusting a switching voltage of the primary switch,
a terminal configured to receive a voltage from an auxiliary winding of a transformer of the voltage controller,
a sampling circuit configured to provide a first voltage based on the voltage at the terminal before the primary switch is turned on and a second voltage based on the voltage at the terminal while the primary switch is turned on, and
an adjustment circuit configured to adjust a turn on-time of the auxiliary switch based on the first voltage and the second voltage.

Example 2

The voltage converter controller of Example 1, wherein the adjustment circuit is configured to adjust a turn-on time of the secondary switch based on a comparison of a difference between the first voltage and the second voltage with at least one threshold value.

Example 3

The voltage converter controller of Example 2, wherein the adjustment circuit is configured to reduce the on-time of the auxiliary switch when the difference is above a first threshold value of the at least one threshold voltage, and to reduce the on-time of the auxiliary switch if the difference between the first voltage and the second voltage is below a second threshold value of the at least one threshold voltage.

Example 4

The voltage converter controller of any one of Examples 1 to 3, wherein the adjustment circuit is configured to adjust the turn-on time of the auxiliary switch to obtain zero voltage switching of the primary switch.

Example 5

The voltage converter controller of any one of Examples 1 to 3, wherein the voltage converter controller is configured to adjust the turn-on time of the auxiliary switch to obtain switching of the primary switch at a switching voltage across the primary switch greater than zero and below an inflection point of a curve of charge stored in an output capacitance of the primary switch versus voltage.

Example 6

The voltage converter controller of Example 5, wherein the switching voltage is between 8 V and 15 V.

Example 7

The voltage converter controller of any one of Examples 1 to 6, wherein the adjustment circuit is configured to adjust the turn-on time of the secondary switch depending on a load current of the voltage converter controller.

Example 8

A voltage converter, comprising:
a primary side circuit configured to receive an input voltage,
a secondary side circuit configured to output an output voltage,
a transformer coupling the primary side circuit and the secondary side circuit,
wherein the primary side circuit comprises a primary switch, and wherein the voltage converter further comprises an auxiliary switch configured to adjust a switching voltage across the primary switch when the primary switch is turned on, and
a voltage converter controller of any one of Examples 1 to 7.

Example 9

The voltage converter of Example 8, further comprising an auxiliary winding of the transformer, wherein the auxiliary winding is coupled to the terminal of the voltage converter controller.

Example 10

The voltage converter controller of any one of Examples 8 or 9, wherein the auxiliary switch is one of an active clamp auxiliary switch, an auxiliary switch coupled to an additional auxiliary winding, or an auxiliary switch of the secondary side circuit.

Example 11

The voltage converter of any one of Examples 8 to 10, wherein the voltage controller is a flyback converter.

Example 12

A method, comprising:
measuring a first voltage using an auxiliary winding of a transformer of a voltage converter before closing a primary switch of a primary side circuit of the voltage controller,
measuring a second voltage using the auxiliary winding while the primary switch is turned on, and
adjusting an on-time of an auxiliary switch to adjust a switching voltage across the primary switch when the primary switch is turned on based on the first and second voltages.

Example 13

The method of Example 12, wherein the adjusting comprises comparing a difference between the first and second voltages to at least one threshold value.

Example 14

The method of Example 13, wherein the comparing comprises increasing an on-time of the auxiliary switch when the difference is below a first threshold value of the at least one threshold voltage, and increasing the reducing the on-time of the auxiliary switch when the difference is above a second threshold value of the at least one threshold value.

Example 15

The method of Example 13 or 14, wherein the at least one threshold value is selected to obtain zero voltage switching.

Example 16

The method of any one of Examples 13 or 14, wherein the at least one threshold value is selected to obtain switching at a switching voltage greater than zero and below an inflection point where an energy stored in an output capacitance of the primary switch plotted over voltage changes its slope by at least 20%.

Example 17

The method of any one of Examples 12 to 16, further comprising adjusting on-time of the auxiliary switch based on a load current output by the voltage converter.

Example 18

The method of any one of Examples 12 to 17, wherein the auxiliary switch is one of an active clamp switch, a switch coupled to an auxiliary winding or a switch on a secondary side circuit of the voltage converter.

Example 19

A voltage converter controller, comprising:
a drive circuit configured to control switching of a primary switch on a primary side circuit of a voltage controller and of an auxiliary switch for adjusting a switching voltage of the primary switch, and
an adjustment circuit configured to adjust a turn on-time of the auxiliary switch to obtain a switching voltage of the primary switch greater than zero and below an inflection point of a curve of charge stored in an output capacitance of the primary switch versus voltage.

Example 20

The voltage converter controller of claim 19, where the inflection point is at a voltage where a first derivative of a

15 product of an on-resistance of the primary switch and the charge stored in the output capacitance with respect to voltage corresponds to a predefined threshold.

Example 21

The voltage converter controller of claim 20, wherein the predefined threshold is 0.1.

Example 22

The voltage converter controller of any one of Examples 19-21, wherein the switching voltage is selected to minimize an overall energy loss.

Example 23

The voltage converter of any one of Examples 19-22, wherein the switching voltage is adjusted to between 30% and 70% of the voltage of the inflection point.

Example 24

The voltage converter of any one of Examples 19-23, wherein the switching voltage is adjusted to between 8V and 15V.

Example 25

A voltage converter, comprising:
a primary side circuit configured to receive an input voltage,
a secondary side circuit configured to output an output voltage,
a transformer coupling the primary side circuit and the secondary side circuit,
wherein the primary side circuit comprises a primary switch, and wherein the voltage converter further comprises an auxiliary switch configured to adjust a switching voltage across the primary switch when the primary switch is turned on, and
a voltage converter controller of any one of Examples 19 to 24.

Example 26

The voltage converter controller of Example 25, wherein the auxiliary switch is one of an active clamp auxiliary switch, an auxiliary switch coupled to an additional auxiliary winding, or an auxiliary switch of the secondary side circuit.

Example 27

The voltage converter of Example 25 or 26, wherein the voltage controller is a flyback converter.

Example 28

A method, comprising:
operating a primary switch of a voltage converter, and adjusting an on-time of an auxiliary switch of the voltage converter to obtain a switching voltage of the primary switch greater than zero and below an inflection point of a curve of charge stored in an output capacitance of the primary switch versus voltage.

Example 29

The method of Example 28, where the inflection point is at a voltage where a first derivative of a product of an on-resistance of the primary switch and the charge stored in the output capacitance with respect to voltage corresponds to a predefined threshold.

Example 30

The method of Example 29, wherein the predefined threshold is 0.1.

Example 31

The method of any one of Examples 28-30, wherein the switching voltage is selected to minimize an overall energy loss.

Example 32

The method of any one of Examples 28-31, wherein the switching voltage is adjusted to between 30% and 70% of the voltage of the inflection point.

Example 33

The method of any one of Examples 28-32, wherein the switching voltage is adjusted to between 8V and 15V.

As can be seen from the various modifications and variations discussed above, the embodiments shown and described serve merely as non-limiting examples and are not to be construed as limiting.

What is claimed is:

1. A voltage converter controller, comprising:
a drive circuit configured to control switching of a primary switch on a primary side circuit of a voltage controller and of an auxiliary switch for adjusting a switching voltage of the primary switch,
a terminal configured to receive a voltage from an auxiliary winding of a transformer of the voltage controller,
a sampling circuit configured to provide a first voltage based on the voltage at the terminal before the primary switch is turned on and a second voltage based on the voltage at the terminal while the primary switch is turned on, and
an adjustment circuit configured to adjust a turn on-time of the auxiliary switch based on the first voltage and the second voltage, wherein the adjustment circuit is configured to adjust the turn-on time of the auxiliary switch based on a comparison of a difference between the first voltage and the second voltage with at least one threshold value.

2. The voltage converter controller of claim 1, wherein the adjustment circuit is configured to reduce the on-time of the auxiliary switch when the difference is above a first threshold value of the at least one threshold voltage, and to reduce the on-time of the auxiliary switch if the difference between the first voltage and the second voltage is below a second threshold value of the at least one threshold voltage.

3. The voltage converter controller of claim 1, wherein the adjustment circuit is configured to adjust the turn-on time of the auxiliary switch to obtain zero voltage switching of the primary switch.

4. The voltage converter controller of claim 1, wherein the voltage converter controller is configured to adjust the turn-on time of the auxiliary switch to obtain switching of the primary switch at a switching voltage across the primary switch greater than zero and below an inflection point of a curve of charge stored in an output capacitance of the primary switch versus voltage.

5. The voltage converter controller of claim 4, wherein the switching voltage is between 8 V and 15 V.

6. The voltage converter controller of claim 1, wherein the adjustment circuit is configured to adjust the turn-on time of the auxiliary switch depending on a load current of the voltage converter controller.

7. A method, comprising:
measuring a first voltage using an auxiliary winding of a transformer of a voltage converter before closing a primary switch of a primary side circuit of the voltage controller,
measuring a second voltage using the auxiliary winding while the primary switch is turned on, and
adjusting an on-time of an auxiliary switch to adjust a switching voltage across the primary switch when the primary switch is turned on based on the first and second voltages wherein the adjusting comprises comparing a difference between the first and second voltages to at least one threshold value.

8. The method of claim 7, wherein the comparing comprises increasing an on-time of the auxiliary switch when the difference is below a first threshold value of the at least one threshold voltage, and increasing the reducing the on-time of the auxiliary switch when the difference is above a second threshold value of the at least one threshold value.

9. The method of claim 7, wherein the at least one threshold value is selected to obtain zero voltage switching.

10. The method of claim 7, wherein the at least one threshold value is selected to obtain switching at a switching voltage greater than zero and below an inflection point where an energy stored in an output capacitance of the primary switch plotted over voltage changes its slope by at least 20%.

11. The method of claim 7, further comprising adjusting on-time of the auxiliary switch based on a load current output by the voltage converter.

12. The method of claim 7, wherein the auxiliary switch is one of an active clamp switch, a switch coupled to an auxiliary winding or a switch on a secondary side circuit of the voltage converter.

13. A voltage converter controller, comprising:
a drive circuit configured to control switching of a primary switch on a primary side circuit of a voltage controller and of an auxiliary switch for adjusting a switching voltage of the primary switch, and
an adjustment circuit configured to adjust a turn on-time of the auxiliary switch to obtain a switching voltage of the primary switch greater than zero and below an inflection point of a curve of charge stored in an output capacitance of the primary switch versus voltage, wherein the inflection point is at a voltage where a first derivative of a product of an on-resistance of the primary switch and the charge stored in the output capacitance with respect to voltage corresponds to a predefined threshold.

14. The voltage converter controller of claim 13, wherein the predefined threshold is 0.1.

15. The voltage converter controller of claim 13, wherein the switching voltage is selected to minimize an overall energy loss.

16. The voltage converter of claim 13, wherein the switching voltage is adjusted to between 30% and 70% of the voltage of the inflection point.

17. The voltage converter of claim 13, wherein the switching voltage is adjusted to between 8V and 15V.

18. A voltage converter, comprising:
a primary side circuit configured to receive an input voltage,
a secondary side circuit configured to output an output voltage,
a transformer coupling the primary side circuit and the secondary side circuit,
wherein the primary side circuit comprises a primary switch, and wherein the voltage converter further comprises an auxiliary switch configured to adjust a switching voltage across the primary switch when the primary switch is turned on, and
a voltage converter controller comprising: a drive circuit configured to control switching of a primary switch on a primary side circuit of a voltage controller and of an auxiliary switch for adjusting a switching voltage of the primary switch,
a terminal configured to receive a voltage from an auxiliary winding of a transformer of the voltage controller,
a sampling circuit configured to provide a first voltage based on the voltage at the terminal before the primary switch is turned on and a second voltage based on the voltage at the terminal while the primary switch is turned on, and
an adjustment circuit configured to adjust a turn on-time of the auxiliary switch based on the first voltage and the second voltage, wherein the adjustment circuit is configured to adjust the turn-on time of the auxiliary switch based on a comparison of a difference between the first voltage and the second voltage with at least one threshold value.

19. The voltage converter of claim 18, wherein the auxiliary switch is one of an active clamp auxiliary switch, an auxiliary switch coupled to an additional auxiliary winding, or an auxiliary switch of the secondary side circuit.

20. The voltage converter of claim 18, wherein the voltage controller is a flyback converter.

21. The voltage converter of claim 18, further comprising an auxiliary winding of the transformer, wherein the auxiliary winding is coupled to the terminal of the voltage converter controller.

22. A method, comprising:
operating a primary switch of a voltage converter, and adjusting an on-time of an auxiliary switch of the voltage converter to obtain a switching voltage of the primary switch greater than zero and below an inflection point of a curve of charge stored in an output capacitance of the primary switch versus voltage, wherein the inflection point is at a voltage where a first derivative of a product of an on-resistance of the primary switch and the charge stored in the output capacitance with respect to voltage corresponds to a predefined threshold.

23. The method of claim 22, wherein the predefined threshold is 0.1.

24. The method of claim 22, wherein the switching voltage is selected to minimize an overall energy loss.

25. The method of claim 22, wherein the switching voltage is adjusted to between 30% and 70% of the voltage of the inflection point.

26. The method of claim 22, wherein the switching voltage is adjusted to between 8V and 15V.

* * * * *